United States Patent
Banjac et al.

(10) Patent No.: US 6,679,995 B1
(45) Date of Patent: Jan. 20, 2004

(54) METHOD OF MICROMECHANICAL MANUFACTURING OF A SEMICONDUCTOR ELEMENT, IN PARTICULAR AN ACCELERATION SENSOR

(75) Inventors: Branko Banjac, Filderstadt (DE); Frank Fischer, Gomaringen (DE); Doris Schielein, Gomaringen (DE); Dirk Bueche, Biberach (DE)

(73) Assignee: Robert Bosch GmbH, Stuttgart (DE)

( * ) Notice: Subject to any disclaimer, the term of this patent is extended or adjusted under 35 U.S.C. 154(b) by 161 days.

(21) Appl. No.: 09/913,458

(22) PCT Filed: Nov. 24, 2000

(86) PCT No.: PCT/DE00/04171

§ 371 (c)(1),
(2), (4) Date: Dec. 18, 2001

(87) PCT Pub. No.: WO01/44822

PCT Pub. Date: Jun. 21, 2001

(30) Foreign Application Priority Data

Dec. 14, 1999 (DE) .......................... 199 60 094

(51) Int. Cl.⁷ .............................. G01P 15/08
(52) U.S. Cl. .............. 216/2; 216/79; 216/80; 438/50; 73/514.32
(58) Field of Search ................ 216/2, 79, 80; 438/50; 73/514.32

(56) References Cited

U.S. PATENT DOCUMENTS

| | | |
|---|---|---|
| 5,550,090 A | 8/1996 | Ristic et al. |
| 5,683,591 A | 11/1997 | Offenberg .................. 216/2 |
| 5,783,749 A | 7/1998 | Lee et al. |
| 5,792,675 A * | 8/1998 | Offenberg ................. 438/52 |
| 6,146,543 A * | 11/2000 | Tai et al. ................... 216/2 |
| 6,174,820 B1 * | 1/2001 | Habermehl et al. ......... 438/745 |
| 6,402,968 B1 * | 6/2002 | Yazdi et al. ............... 216/2 |

FOREIGN PATENT DOCUMENTS

| | | |
|---|---|---|
| DE | 43 17 274 | 12/1994 |
| DE | 195 26 691 | 1/1997 |
| DE | 197 30 715 | 11/1998 |
| DE | 197 34 113 | 2/1999 |

OTHER PUBLICATIONS

Offenberg, M. et al., "Acceleration Sensor in Surface Micromachining for Airbag Applications with High Signal/Noise Ratio", Sensors and Actuators, International Congress & Exposition, SAE (Society of Automotive Engineers) Technical Paper Series, Feb. 26–29, 1996, pp. 35–41.

* cited by examiner

Primary Examiner—Anita Alanko
(74) Attorney, Agent, or Firm—Kenyon & Kenyon

(57) ABSTRACT

A method of micromechanically manufacturing fixed and movable layer-like electrodes of a semiconductor element, for example, a capacitive acceleration sensor, which are exposed over a substrate over a certain area is provided. A sacrificial layer may be arranged between the substrate and the fixed and movable electrodes being removed in an etching step in order to expose the electrodes with respect to the substrate. The thickness of the sacrificial layer located in the area of the fixed electrodes may be less than the thickness of the sacrificial layer located in the area of the movable electrodes.

9 Claims, 5 Drawing Sheets

METHOD OF MICROMECHANICAL MANUFACTURING OF A SEMICONDUCTOR ELEMENT, IN PARTICULAR AN ACCELERATION SENSOR

FIELD OF THE INVENTION

The present invention relates to a method of micromechanical manufacturing of fixed and movable layer-like electrodes of a semiconductor element, for example, a capacitive acceleration sensor, which are exposed over a substrate over a certain area, a sacrificial layer arranged between the substrate and the fixed and movable electrodes being removed in an etching step in order to expose the electrodes with respect to the substrate, and an acceleration sensor thus manufactured.

BACKGROUND INFORMATION

It is believed that in manufacturing semiconductor elements using micromechanical technology, such as acceleration and rotational speed sensors, for example, a silicon dioxide sacrificial layer may be selectively etched in order to obtain the functional components made of silicon. This reactive etching of the sacrificial layer may take place in the gas phase via an azeotropic mixture of $H_2O$ and HF. See, for example, M. Offenberg et al., "Acceleration Sensor in Surface Micromachining for Airbag Applications with High Signal/Noise Ratio"; Sensors and Actuators, 1996, page 35, and German Published Patent Application No. 4 317 274.

In the event of insufficient progress during the process, oxide residues may remain underneath the functional component layer, which may result in interference and inaccurate response behavior in sensors, for example, acceleration sensors having non-movable electrode fingers fixed on one side. These residues may appear at technologically unfavorable points which are characterized by the fact that, after the sacrificial layer has been etched, the functional layer over them is arched upward from the etching front due to the intrinsic stress gradient, and in the process end state the distance between the bottom of the structure layer and the top of the sacrificial layer becomes greater. There are technologically favorable points where the distance between the surface of the sacrificial layer and the bottom of the structure layer underneath the components anchored on both sides, such as elastically suspended seismic masses of an acceleration sensor, may be reduced due to the intrinsic stress gradient. An increased etching rate may result, which may cause considerable inhomogeneity of the etching rate within a sensor structure, which may result in oxide residues underneath the fixed electrodes and leaves considerable underetching in other places.

The considerably inhomogeneous etching rate underneath the non-movable electrode fingers fixed on one side and the movable central mass of an acceleration sensor may result in a criterion for ending the etching process that is difficult to define when such acceleration sensors are mass produced. Considerable unwanted underetching may occur at several points of the component, for example, at the electric leads, while substantial oxide residues affecting the functionality of the sensor structure still exist in the area of the sensor core underneath the fixed electrodes.

SUMMARY OF THE INVENTION

An exemplary method of the present invention is directed to providing a method which allows micromechanical manufacture of components in view of the difficult of the microscopically inhomogeneous etching rate in the manufacturing of semiconductor elements, where layer-like electrode areas are exposed using sacrificial layer etching, as in the case of fixed, comb-like electrodes of an acceleration sensor.

Another exemplary method of the present invention is directed to providing a method which allows the micromechanical manufacture of components in which the etching rate in selective isotropic etching of silicon dioxide in an $H_2O$/HF gas phase can be homogenized on a microscopic scale.

Another exemplary embodiment and/or exemplary method of the present invention is directed to reducing the thickness of the sacrificial oxide layer underneath the non-movable electrode fingers fixed on one side. Thus the etching rate may be substantially increased for kinetic reasons at these points and may approach the etching rate underneath the seismic mass. It is believed that reduction of the thickness of the sacrificial oxide layer underneath the fixed electrode fingers may be achieved by correspondingly increasing the thickness of the epitaxial polycrystalline silicon layer formed over the sacrificial layers which is the material of the subsequently etched bare electrode fingers.

In another exemplary embodiment and/or exemplary method of the present invention, the total time of the gas phase etching process (GPA) may be substantially reduced by adjusting the etching rate underneath the seismic mass and the fixed electrode fingers. This may also provide improved homogeneity of the oxide removal from the sacrificial layer or sacrificial layers within a semiconductor element, for example, an acceleration sensor structure, over the entire wafer.

Another exemplary method of the present invention is directed to providing a method of micromechanical manufacture of fixed and movable layer-like electrodes of a semiconductor element, for example, a capacitive acceleration sensor, which may be exposed over a substrate over a certain area, a sacrificial layer arranged between the substrate and the fixed and movable electrodes being removed in an etching step in order to expose the electrodes with respect to the substrate. The thickness of the sacrificial layer located in the area of the fixed electrodes may be less than the thickness of the sacrificial layer located in the area of the movable electrodes.

Another exemplary method of the present invention is directed to providing a method where the thickness of the fixed electrodes after sacrificial layer etching is greater than the thickness of the movable electrodes. The increase in the thickness of the fixed electrode fingers of a sensor structure of this kind may result in the following effects.

For example, if the functional structures had the same layer thickness, the effective capacitive electrode area may be reduced, since a fixed electrode finger may be bent upward due to the stress gradient. Since at the same time the seismic mass, fixed on both sides, may arch downward, the electrode area of the opposite electrodes may be effectively reduced.

For example, if the fixed electrodes have a greater thickness than the movable electrodes, the central mass itself may still be opposite the counterelectrode in the event of a high stress gradient.

In the proposed layer structure, the sacrificial layer underneath an area of the fixed electrodes may be composed of a first sacrificial layer, and the sacrificial layer underneath an area of the movable electrodes may be composed of the above-named first sacrificial layer and a second sacrificial layer located directly over it.

Another exemplary method of the present invention is directed to providing a method of manufacturing in the following consecutive steps:

a) applying the first sacrificial layer to the entire surface of the substrate so that it covers the areas where the fixed and movable electrodes are subsequently formed;

b) applying a first conductive layer over the first sacrificial layer so that it only covers the area where the fixed electrodes are subsequently formed;

c) applying the second sacrificial layer to the entire surface of the first sacrificial layer and the first conductive layer so that it covers the areas where the fixed and movable electrodes are subsequently formed;

d) opening the second sacrificial layer via the first conductive layer using a masked etching step so that the first conductive layer is exposed and only a small portion of the depth of the first sacrificial layer is etched away;

e) applying a relatively thick doped epitaxial layer to the entire surface of the second sacrificial layer and the conductive layer exposed in step d) to the thickness of the fixed and movable electrodes to be subsequently formed;

f) applying a mask structuring the fixed and movable electrodes to the surface of the epitaxial layer, and, using the mask, ditches are etched into the epitaxial layer to a depth delimited by the surface of the first sacrificial layer in the area of the fixed electrodes and by the surface of the second sacrificial layer in the area of the movable electrodes; and g) isotropically etching the first and second sacrificial layers, resulting in approximately the same underetching rates of the sacrificial layer underneath the fixed electrodes and of the sacrificial layers underneath the movable electrodes.

Another exemplary embodiment and/or exemplary method of the present invention is directed to providing that the thickness of the first sacrificial layer is in the range of 0.5–5 µm and the thickness of the second sacrificial layer is in the range of 0.5–3 µm.

Another exemplary embodiment and/or exemplary method of the present invention is directed to providing that the thickness of the fixed electrodes is 1.5–20 µm and the width of the fixed and movable electrode strips or electrode fingers of an acceleration sensor manufactured according to the exemplary embodiment and/or exemplary method of the present invention is in the range of 1–5 µm.

Another exemplary method of the present invention is directed to providing a method where both the thickness of the seismic mass and that of the fixed electrode finger in the area of the sensor core may be increased to the same extent. In doing so, it should be ensured that the thickness of the sacrificial layer is not reduced in the area of the suspension points. The function layer may be connected to the conductor via a bridge underneath the fixed electrode. This mechanical connection may not be destabilized during the gas phase etching because the sacrificial layer is thicker underneath the movable electrode structures than in the area underneath the fixed electrode structures.

Another exemplary embodiment of the present invention is directed to providing an acceleration sensor manufactured using the exemplary method of the present invention which has a plurality of movable electrodes projecting from an elastically suspended movable mass designed as a central bar, alternating with non-movable electrodes fixed on one side or on both sides, which are opposite the movable electrodes. The electrodes fixed on one side may have a conductive electrode strip connecting them on their end facing away from the central bar of the movable mass and directed perpendicular to the teeth of the comb-like electrodes.

Another exemplary embodiment and/or exemplary method of the present invention is directed to providing that the etching rate is the same underneath the fixed electrodes and the movable central mass, so that the acceleration sensors or rotational speed sensors may be mass manufactured with a considerably higher yield and higher reliability.

DETAILED DESCRIPTION

Figure 1:
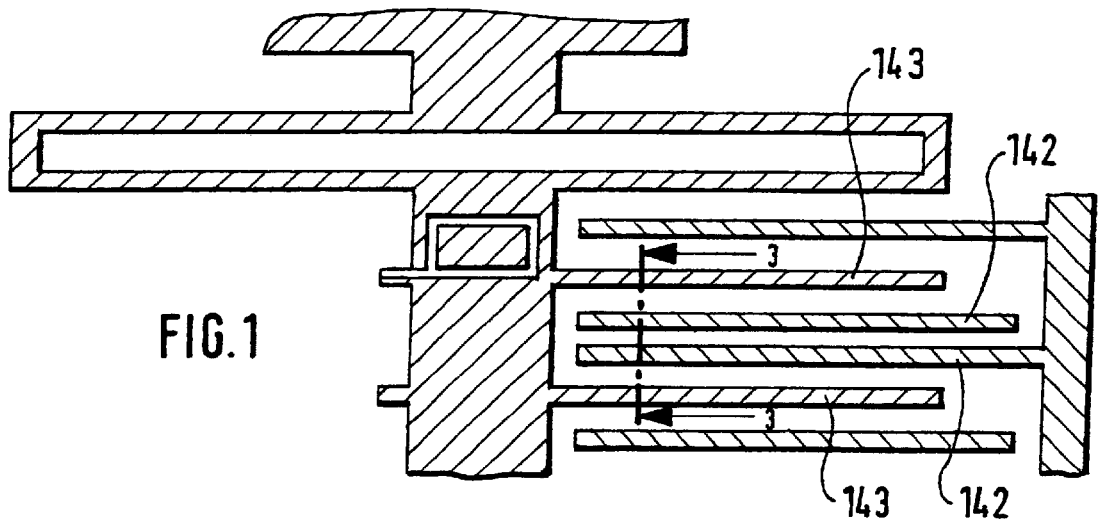
FIG. 1 shows a top plane view of an acceleration sensor that can be manufactured using an exemplary method according to the present invention.

FIG. 1 shows, via top view, a capacitive acceleration sensor which can be manufactured using an exemplary method embodiment according to the present invention. The capacitive acceleration sensor shown may have a movable central mass and movable electrodes 143 projecting from it. Alternating with movable electrodes 143, fixed electrodes 142 which may be connected by a printed conductor are provided. The electrodes may be manufactured from doped polycrystalline silicon or from germanium in a thickness of between 1.5 and 20 µm. The conductors may be made of doped polycrystalline silicon in a thickness of between 0.3 µm and 1 µm. The movable mass may oscillate in the Y direction, i.e., the vertical direction in the plane of the drawing, a U spring determining the point of rest of the oscillation and a deflection limit determining the maximum deflection.

The structural measures proposed may allow equalizing the underetching rate of the sacrificial layer or sacrificial layers underneath fixed electrodes 142 and underneath movable electrodes 143 arranged on the movable mass. The etching behavior may thereby be homogenized and the processing time may be significantly reduced. In such exemplary embodiments, the etching rate may be increased only in the area of the sensor core and not in the areas of electric leads.

Another exemplary method of the present invention, in accordance with FIG. 1, is directed to providing in the case of thick oxides (lateral attack in the underetching of structure layers) and attack of unstructured oxide surfaces (vertical attack on free oxide surfaces) that the etching rate of $SiO_2$ in selective isotropic etching in an $HF-H_2O$ gas phase is determined by the concentration of the reaction partners HF and $H_2O$. The reactive attack in the gas phase may be described, in a simplified manner, by the following reaction equations:

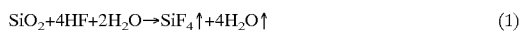

$$SiO_2 + 4HF + 2H_2O \rightarrow SiF_4\uparrow + 4H_2O\uparrow \quad (1)$$

$$SiO_2 + 6HF \rightarrow H_2SiF_6 + 2H_2O\uparrow \quad (2)$$

$$H_2SiF_6 \triangle SiF_4\uparrow 1 + 2HF\uparrow \quad (3)$$

HF is consumed in the reaction with $SiO_2$. The water involved in the reaction initiates the etching attack of $SiO_2$ by HF according to equation (1). It is left, however, unchanged again after the reaction and may enter a new reaction according to equation (1).

The etching rate may be influenced by controlling the kinetic supply and removal of the reactants to and from the surface almost independently of the mean concentration of the reaction partners in the gas phase. Dependence on the kinetic conditions may be observed when etching thin oxides which are used, for example, as sacrificial layers underneath structure layers. It has been found that the lateral etching rate (underetching rate) may depend on the thickness of the sacrificial layer. Thus, for a 1.6 µm thin $SiO_2$, the underetching rate can be found to be approximately 1.5 times higher than for a 4 µm thick oxide. See FIG. 2.

This effect may be explained by the fact that the $H_2O$ involved in the etching reaction of $SiO_2$ escapes slowly from the narrow gap between substrate and function layer exposed by the etching front. This may cause the rapid reaction according to equation (1) to occur preferentially, which increases the etching rate considerably. In the case of a thick oxide, the removal of $H_2O$ may be hindered by the gap geometry to a lesser extent, which contributes to a lower etching rate than in the case of a thin oxide.

Figure 2:
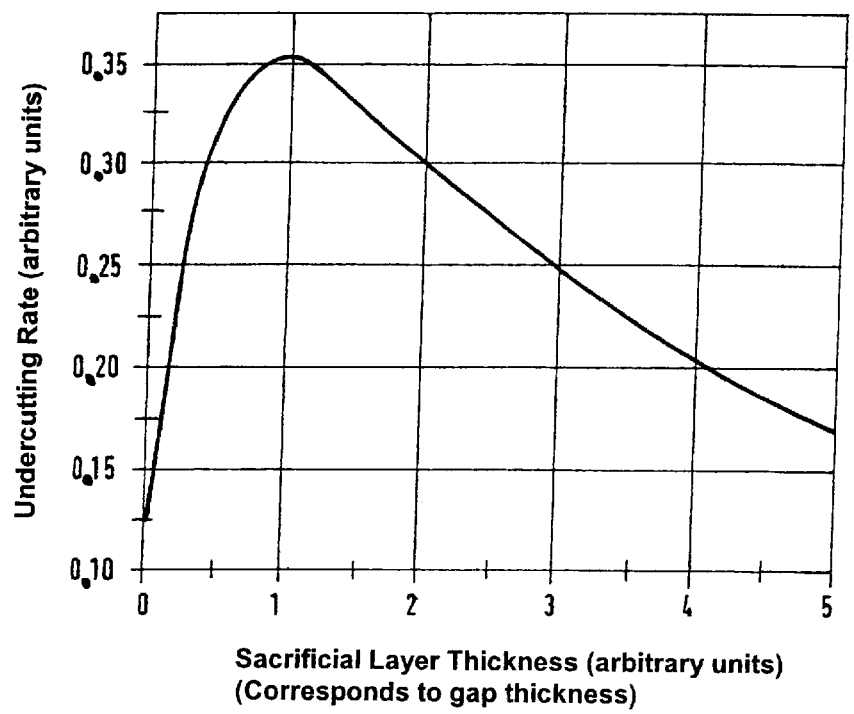
FIG. 2 shows the variation of the etching rate when etching the sacrificial layer as a function of the thickness of the sacrificial layer (gap width).

FIG. 2 shows the variation of the etching rate with the thickness of the sacrificial oxide layer.

This effect may be noticeable in etching micromechanical structures such as, for example, in the manufacture of the exemplary acceleration sensor of FIG. 1, and may result in considerable inhomogeneity of the underetching rate within a sensor element.

This effect has been observed in electron micrographs of acceleration sensors, where it may be seen that the sacrificial oxide underneath the central movable mass has been completely removed during gas phase etching. In contrast, in bare electrodes suspended on one side substantial residues of unetched oxide were observed. These oxide residues may appear exclusively underneath the ends of the fixed electrodes.

The microscopic inhomogeneity of the etching rate under the structure of an acceleration sensor may be explained taking into account the dependence of the underetching rate on the water removal which in turn may be influenced by kinetic factors.

In an actual component, the stress gradient in the structure layer of a strip-shaped electrode (bar) fixed on one side results in bending upward, since one of the ends is free. This may increase the distance between the electrode strips and the oxide surface, especially in the end region of the electrode finger, which may allow the water involved in the reaction to escape more rapidly. As a result, the etching rate may be substantially reduced and oxide residues may remain, for example, in the area of the bent fixed electrodes, after the process is terminated.

In the case of a bar fixed on both sides, the downward distance may be reduced by the stress gradient, since the bar bends downward with its free central section. The movable central mass connected to two U springs corresponds to this case. In this case, the reaction product can only escape slowly, which may increase the etching rate, and the probability of oxide residues remaining after the process has been terminated may be low.

Another exemplary embodiment and/or exemplary method of the present invention is directed to providing a layer structure, in view of the microscopically inhomogeneous etching rate, through which the underetching rate in the area of the non-movable electrodes fixed on one side and that of the movable seismic mass fixed on both sides may be equalized. This structural measure may accelerate the etching rate underneath the fixed electrodes, which may result in the overall process time in gas phase etching being reduced by a factor of 1.5. Also, the underetching in the area of the unprotected conductors may be reduced compared to that of the sensor structure.

The layer structure and the exemplary method steps are explained with respect to FIGS. 3A–3H, which show a cross-section of an exemplary acceleration sensor according to FIG. 1 in the area of the sensor core along section line 3—3.

Figure 3A:
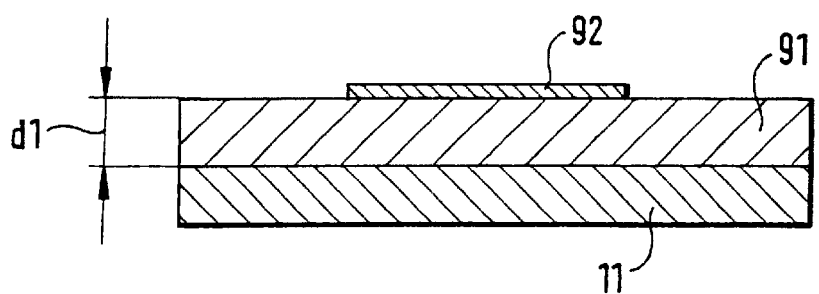
FIG. 3A shows a formation of layers in an order of the exemplary method steps according to the present invention, in cross-section along section line 3—3 according to FIG. 1.

FIG. 3A shows that a first sacrificial layer 91, which may be which may be made from $SiO_2$ or phosphorus silicate glass, having a thickness d1, may be applied to a substrate 11 and a first conductive layer 92 may be applied to first sacrificial layer 91. Conductive layer 92 may be structured by the method into narrow strips. This layer may be used as a conductor in other areas of the sensor element. Thickness d1 of first sacrificial layer 91 may be between 0.5 µm and 5 µm. Conductor 92 may be between 0.3 µm and 1 µm thick.

Figure 3B:
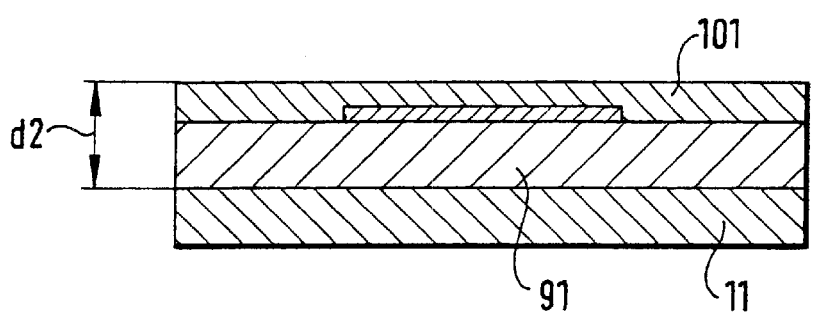
FIG. 3B shows another of the layers in the order of the exemplary method steps according to the present invention, in cross-section along section line 3—3 according to FIG. 1.

In the next step shown in FIG. 3B, a second sacrificial layer 101 may be deposited. The second sacrificial layer 101 may be made of $SiO_2$ produced using a CVD method. Its thickness should be in the range between 0.5 µm and 3 µm.

Figure 3C:
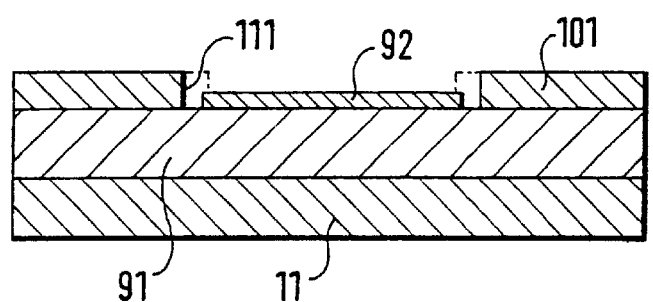
FIG. 3C shows another of the layers in the order of the exemplary method steps according to the present invention, in cross-section along section line 3—3 according to FIG. 1.

FIG. 3C shows that second sacrificial layer 101 may be opened using a masked etching step, for example by reactive ion etching (RIE) in order to expose conductor 92. Opening 111 thus produced may be of the same size as, smaller, or somewhat larger than the length of conductor 92. When second sacrificial layer 101 is opened, it should be ensured that no more than 0.5 µm of the depth of the first sacrificial layer is etched away.

Figure 3D:
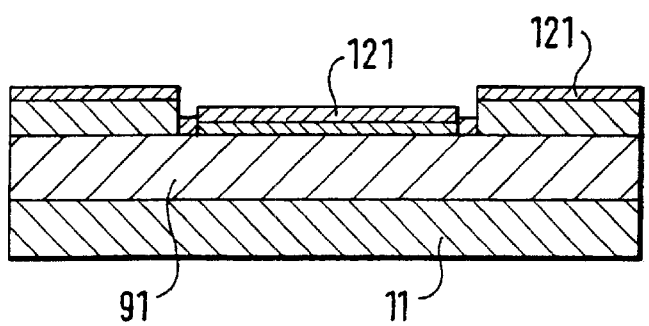
FIG. 3D shows another of the layers in the order of the exemplary method steps according to the present invention, in cross-section along section line 3—3 according to FIG. 1.

FIG. 3D shows the deposition of a thin, doped silicon nucleation layer 121, which may be deposited at low temperatures in order to facilitate the deposition of a thick Si layer.

Figure 3E:
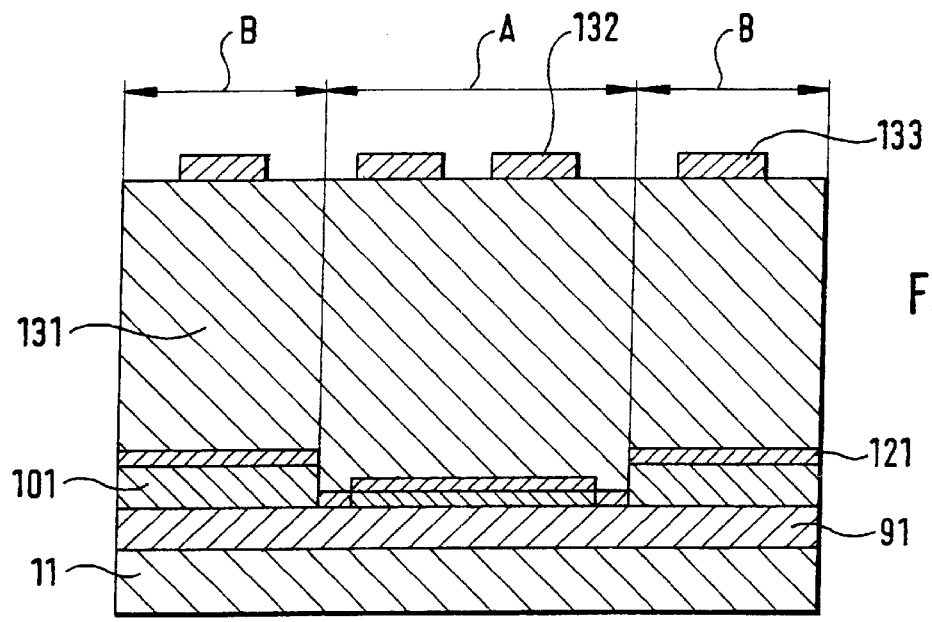
FIG. 3E shows another of the layers in the order of the exemplary method steps according to the present invention, in cross-section along section line 3—3 according to FIG. 1.

FIG. 3E shows a thick, doped epitaxial silicon layer 131 deposited, at high temperatures, on nucleation layer 121 deposited according to FIG. 3D. This polycrystalline silicon film 131 is then finished by a chemical-mechanical polishing step so that layer 131 may have a smooth surface. A mask 132, 133 which may be composed of photoresist, oxide, or metal is structured on this surface. This masking 132, 133 may correspond to the structure of fixed electrodes 142 and movable electrodes 143. In the same manner, the dimension of the opening 111 produced in second sacrificial layer 101 according to FIG. 3C corresponds to an area A of fixed electrodes 142, while the section of second sacrificial layer 101 remaining on both sides of opening 111 defines an area B of movable electrodes 143.

Figure 3F:
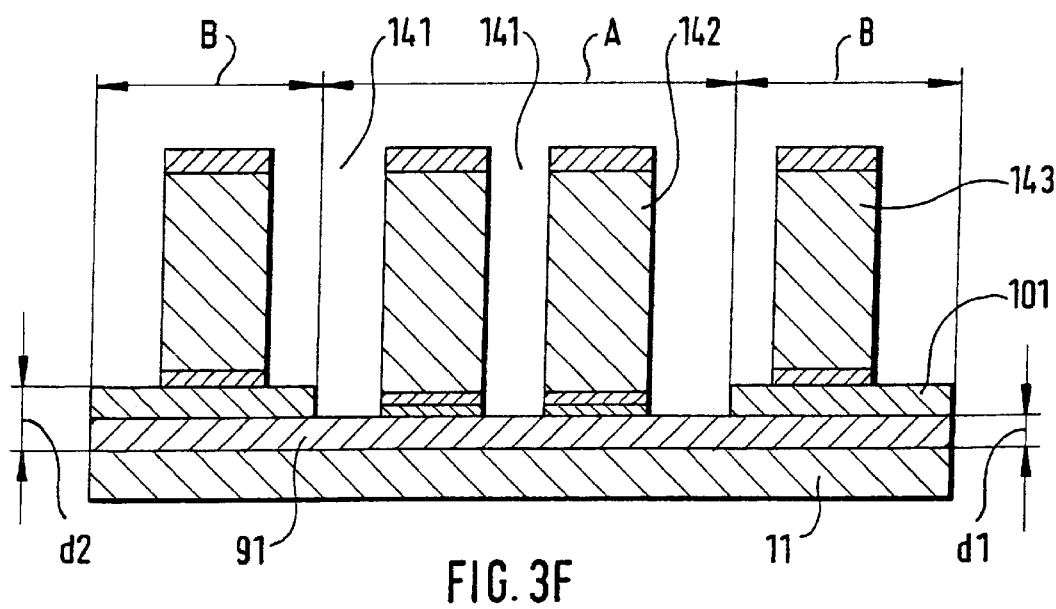
FIG. 3F shows another of the layers in the order of the exemplary method steps according to the present invention, in cross-section along section line 3—3 according to FIG. 1.

FIG. 3F shows deep ditches 141 etched in an anisotropic etching step into structure layer 131 formed in FIG. 3E. The etching attack selectively may stop at first sacrificial layer 91 in area A of fixed electrodes 142 and at second sacrificial layer 101 in area B of movable electrodes 143. Thus a thick sacrificial oxide layer (thickness d2), composed of sacrificial layers 91, 101, may be underneath the structure layer sections (B) provided for the movable electrodes, while only thinner oxide layer 91 (thickness d1<d2) is underneath the structure layers provided for forming fixed electrodes 142 within area A.

Subsequently sacrificial layers 91, 101 may be isotropically etched. The increase in the etching rate due to kinetics underneath fixed electrodes 142 may result in rapid underetching, at a rate which may be higher than the underetching rate in the area of movable electrodes 143.

Figure 3G:
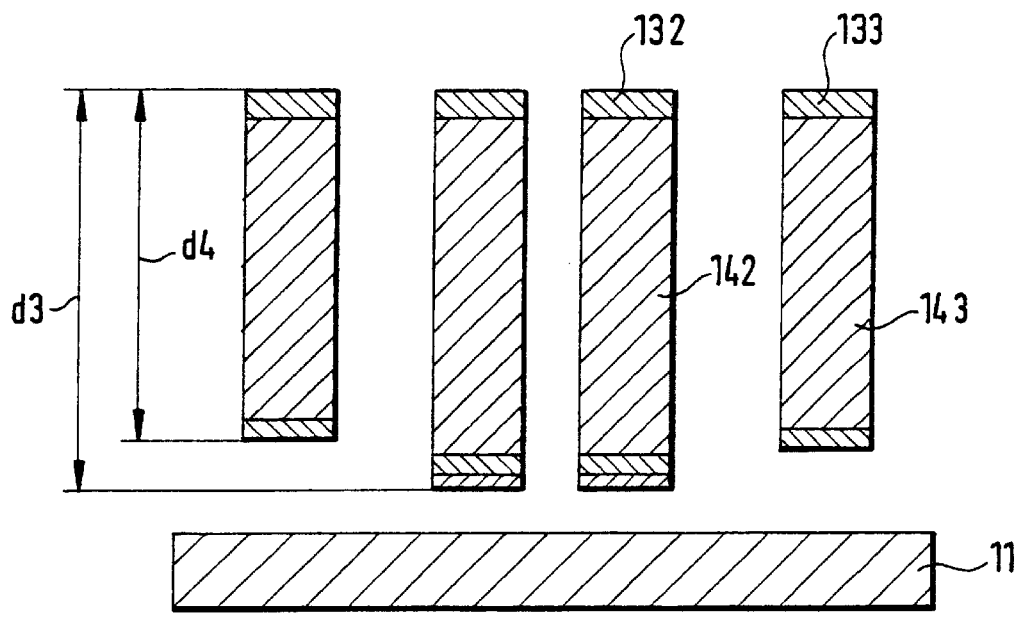
FIG. 3G shows another of the layers in the order of the exemplary method steps according to the present invention, in cross-section along section line 3—3 according to FIG. 1.
Figure 3H:
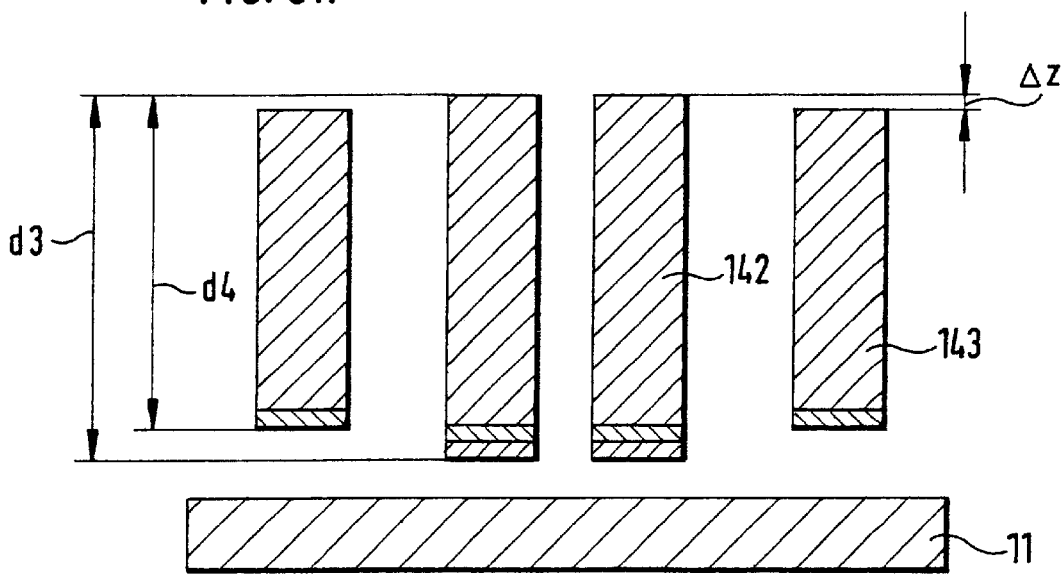
FIG. 3H shows another of the layers in the order of the exemplary method steps according to the present invention, in cross-section along section line 3—3 according to FIG. 1.

FIGS. 3G and 3H show the smaller thickness d4 of movable electrodes 143 and the greater thickness d3 of fixed electrodes 142 that may result in such an exemplary embodiment of the present invention.

FIG. 3H shows that movable electrode 143, fixed on two sides may be pressed downward by a distance Δz due to the stress gradient of the structure layer, resulting in a higher etching rate here, which may be comparable to the etching rate underneath fixed electrodes 142.

Figure 4:
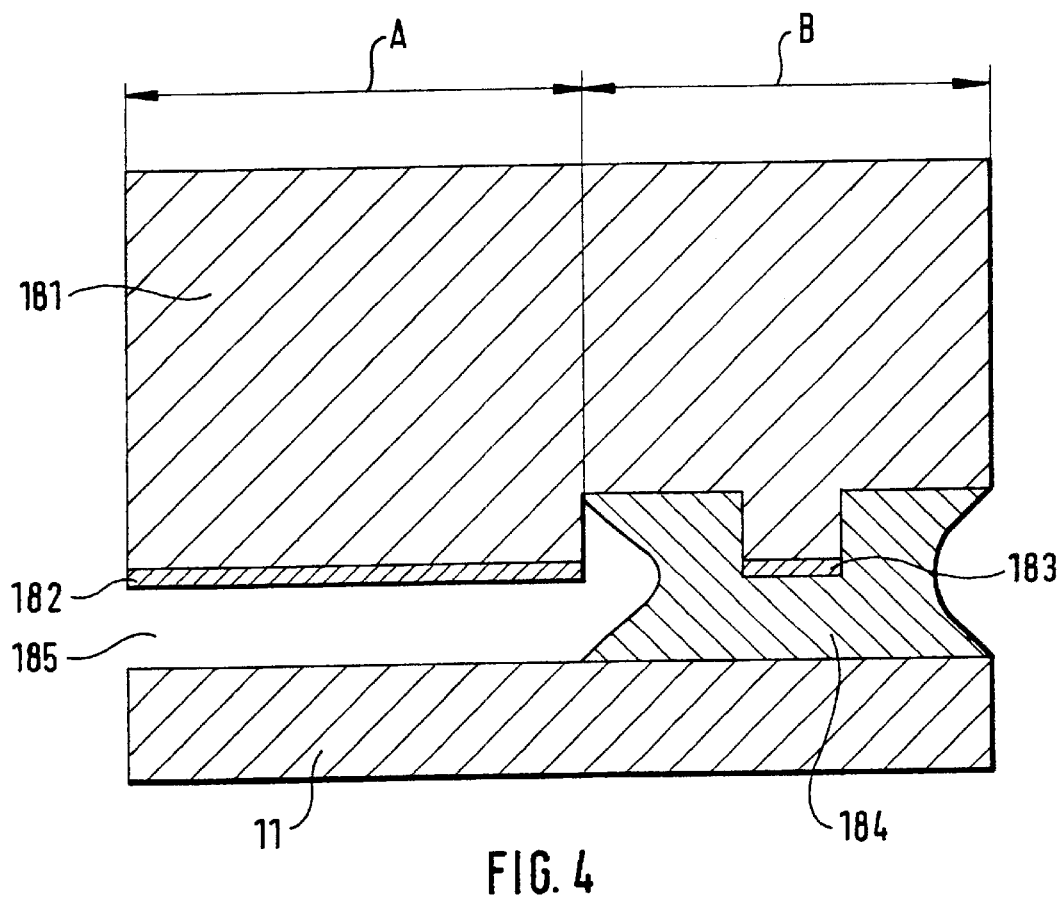
FIG. 4 shows a cross-section through an acceleration sensor according to FIG. 1 along section line 3—3 according to another exemplary embodiment of the present invention.

FIG. 4 shows the cross-section of the structure according to another exemplary embodiment of the present invention in which fixed and movable electrodes of the same thickness may be achieved. The thickness of both the seismic mass and the fixed electrode finger in the area of the sensor core may be increased using the process sequence of the exemplary method of the present invention according to FIGS. 3A–3H. It should be ensured here that the thickness of the sacrificial layer in the area of the points of suspension is not diminished. According to FIG. 4, function layer 181 may be connected to conductor 183 via a bridge. This mechanical connection may not be destabilized during gas phase etching because sacrificial layer 184 is thicker than in area 185 underneath structures 182.

What is claimed is:

1. A method of micromechanically manufacturing a layered fixed electrode and a layered movable electrode of a semiconductor element, which are exposed over a substrate, over a certain area, comprising:

removing a sacrificial layer by etching to expose the fixed electrode and the movable electrode with respect to the substrate; wherein:
the sacrificial layer is arranged between the substrate and the fixed electrode and the movable electrode, the substrate being on a first side on the sacrificial layer, and the fixed electrode and the moveable electrode being on a second side of the sacrificial layer, the first side being a side opposite the second side; and
a first thickness of the sacrificial layer located in a first area of the fixed electrode is less than a second thickness of the sacrificial layer located in a second area of the movable electrode.

2. A method of micromechanically manufacturing a layered fixed electrode and a layered movable electrode of a semiconductor element, which are exposed over a substrate, over a certain area, comprising:

removing a sacrificial layer by etching to expose the fixed electrode and the movable electrode with respect to the substrate; wherein:
the sacrificial layer is arranged between the substrate and the fixed electrode and the movable electrode;
a first thickness of the sacrificial layer located in a first area of the fixed electrode is less than a second thickness of the sacrificial layer located in a second area of the movable electrode; and
wherein the first thickness of the fixed electrode is greater than the second thickness of the movable electrode, the removing of the sacrificial layer by etching.

3. A method of micromechanically manufacturing a layered fixed electrode and a layered movable electrode of a semiconductor element, which are exposed over a substrate, over a certain area, comprising:

removing a sacrificial layer by etching to expose the fixed electrode and the movable electrode with respect to the substrate; wherein:
the sacrificial layer is arranged between the substrate and the fixed electrode and the movable electrode;
a first thickness of the sacrificial layer located in a first area of the fixed electrode is less than a second thickness of the sacrificial layer located in a second area of the movable electrode; and
wherein the sacrificial layer underneath the first area of the fixed electrode includes a first sacrificial layer, and the sacrificial layer underneath the second area of the movable electrode includes the first sacrificial layer and a second sacrificial layer located above the first sacrificial layer.

4. The method of claim 3, further comprising:

applying the first sacrificial layer to an entire surface of the substrate so that the first sacrificial layer covers the first area and the second area where the fixed electrode and the movable electrode are subsequently formed;

applying a first conductive layer over the first sacrificial layer so that the first conductive layer only covers the first area where the fixed electrode is subsequently formed;

applying the second sacrificial layer to an entire surface of the first sacrificial layer and the first conductive layer so that the second sacrificial layer covers the first area and the second area where the fixed electrode and the movable electrode are subsequently formed;

opening the second sacrificial layer via the first conductive layer by a masked etching to expose the first conductive layer and to etch away a small depth portion of a depth of the first sacrificial layer to provide an exposed first conductive layer;

applying a relatively thick, doped epitaxial layer to an entire surface of the second sacrificial layer and the exposed first conductive layer to a thickness of the fixed layer-like electrode and a thickness of the movable electrode to be formed subsequently;

applying a mask patterning the fixed electrode and the movable electrode to a surface of the epitaxial layer and using the mask to etch ditches into the epitaxial layer to a depth delimited by a surface of the first sacrificial layer in the first area of the fixed electrode and by a surface of the second sacrificial layer in the second area of the movable electrode; and isotropically etching the first sacrificial layer and the second sacrificial layer for providing approximately same undercutting rates of the sacrificial layer underneath the fixed electrode and of the sacrificial layer underneath the movable electrode; wherein the steps are consecutively performed.

5. A method of micromechanically manufacturing a layered fixed electrode and a layered movable electrode of a semiconductor element, which are exposed over a substrate, over a certain area, comprising:
   removing a sacrificial layer by etching to expose the fixed electrode and the movable electrode with respect to the substrate; wherein:
      the sacrificial layer is arranged between the substrate and the fixed electrode and the movable electrode;
      a first thickness of the sacrificial layer located in a first area of the fixed electrode is less than a second thickness of the sacrificial layer located in a second area of the movable electrode; and
      wherein the thickness of the first sacrificial layer is in a range of 0.5 $\mu$m to 5 $\mu$m and the thickness of the second sacrificial layer is in a range of 0.5 $\mu$m to 3 $\mu$m.

6. A method of micromechanically manufacturing a layered fixed electrode and a layered movable electrode of a semiconductor element, which are exposed over a substrate, over a certain area, comprising:
   removing a sacrificial layer by etching to expose the fixed electrode and the movable electrode with respect to the substrate; wherein:
      the sacrificial layer is arranged between the substrate and the fixed electrode and the movable electrode;
      a first thickness of the sacrificial layer located in a first area of the fixed electrode is less than a second thickness of the sacrificial layer located in a second area of the movable electrode; and
      wherein the thickness of the fixed electrode is in a range of 1.5 $\mu$m to 20 $\mu$m.

7. A method of micromechanically manufacturing a layered fixed electrode and a layered movable electrode of a semiconductor element, which are exposed over a substrate, over a certain area, comprising:
   removing a sacrificial layer by etching to expose the fixed electrode and the movable electrode with respect to the substrate; wherein:
      the sacrificial layer is arranged between the substrate and the fixed electrode and the movable electrode;
      a first thickness of the sacrificial layer located in a first area of the fixed electrode is less than a second thickness of the sacrificial layer located in a second area of the movable electrode; and
      wherein the fixed electrode and the movable electrode are provided in a form of an electrode strip, a width of each electrode strip being in a range of 1 $\mu$m to 5 $\mu$m.

8. A micromechanically manufactured acceleration sensor comprising:
   a layered fixed electrode;
   a layered movable electrode;
   a substrate wherein the fixed electrode and the movable electrode are bare over the substrate;
   a sacrificial layer wherein:
      the sacrificial layer is removed by etching to expose the fixed electrode and the movable electrode with respect to the substrate, and the sacrificial layer is arranged between the substrate and the fixed electrode and the movable electrode, the substrate being on a first side on the sacrificial layer, and the fixed electrode and the moveable electrode being on a second side of the sacrificial layer, the first side being a side opposite the second side; and
      a first thickness of the sacrificial layer located in a first area of the fixed electrode is less than a second thickness of the sacrificial layer located in a second area of the movable electrode.

9. The method of claim 1, wherein the semiconductor element includes a capacitive acceleration sensor.

* * * * *